(12) United States Patent
Kim

(10) Patent No.: US 9,524,998 B2
(45) Date of Patent: *Dec. 20, 2016

(54) IMAGE SENSOR HAVING PIXELS CAPABLE OF DETECTING PHASE DIFFERENCES WITH EACH PIXEL INCLUDES DUAL COLOR FILTER LAYER OVERLAPPING EACH OTHER

(71) Applicant: SK hynix Inc., Gyeonggi-do (KR)

(72) Inventor: Sang-Sik Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 126 days.

This patent is subject to a terminal disclaimer.

(21) Appl. No.: 14/469,121

(22) Filed: Aug. 26, 2014

(65) Prior Publication Data

US 2015/0357364 A1 Dec. 10, 2015

(30) Foreign Application Priority Data

Jun. 9, 2014 (KR) .................... 10-2014-0069504

(51) Int. Cl.
*H01L 27/146* (2006.01)

(52) U.S. Cl.
CPC ..... *H01L 27/14621* (2013.01); *H01L 27/1464* (2013.01); *H01L 27/14627* (2013.01)

(58) Field of Classification Search
CPC ............. H01L 27/322; H01L 27/14621; H01L 27/14627; H01L 27/14625; H01L 51/5284
USPC ... 250/208.1, 214.1, 226, 239; 348/273–311; 257/290–292, 440–444
See application file for complete search history.

(56) References Cited

U.S. PATENT DOCUMENTS

| 8,786,739 B2 * | 7/2014 | Kurihara ........... H01L 27/14621 348/273 |
| 2015/0098007 A1 * | 4/2015 | Harasawa ......... H01L 27/14621 348/342 |

FOREIGN PATENT DOCUMENTS

| KR | 100749271 | 8/2007 |
| KR | 1020130011140 | 1/2013 |

* cited by examiner

*Primary Examiner* — Que T Le
(74) *Attorney, Agent, or Firm* — IP & T Group LLP

(57) ABSTRACT

An image sensor includes a plurality of pixels arranged in two dimensions, wherein at least one pixel includes: a photoelectric conversion layer formed in a substrate; a first color filter layer formed over the photoelectric conversion layer; and a second color filter layer formed over the first color filter layer and defining an opening that is eccentrically formed with respect to an optical axis of the photoelectric conversion layer.

23 Claims, 9 Drawing Sheets

IMAGE SENSOR HAVING PIXELS CAPABLE OF DETECTING PHASE DIFFERENCES WITH EACH PIXEL INCLUDES DUAL COLOR FILTER LAYER OVERLAPPING EACH OTHER

CROSS-REFERENCE TO RELATED APPLICATIONS

The present application claims priority of Korean Patent Application No. 10-2014-0069504, filed on Jun. 9, 2014, which is incorporated herein by reference in its entirety.

BACKGROUND

1. Field

Various embodiments of the present invention relate to semiconductor device fabrication technology and, more particularly, to an image sensor having pixels capable of detecting phase differences.

2. Description of the Related Art

Most imaging devices, such as digital cameras and camcorders, adopt auto-focus systems. Auto-focus systems are divided into those that use a phase difference detecting scheme and those that use a contrast detecting scheme.

Phase difference auto-focus systems have a sensor for detecting phase differences in addition to an image sensor. Auto-focusing is accomplished by adjusting the lens based on an output of the phase difference detecting sensor. The phase difference auto-focus detecting scheme also requires a mirror. For example, in an auto-focusing scheme for a Digital Single Lens Reflection (DSLR) camera, a sub-mirror for guiding incident light into the phase difference detecting sensor is provided in addition to a main mirror. The phase difference-based auto-focusing is advantageous in that fast-high-performance auto-focusing is possible. However, the phase difference-based auto-focusing is a high-cost system since it requires both a sensor dedicated to phase difference-based auto-focusing, and an optical system.

In comparison, contrast detecting scheme auto-focus systems rely on high-frequency data from the image sensor. This method of auto-focusing is referred to as a contrast auto-focusing. Since contrast auto-focusing does not require the signal processing circuit and the additional sensor, which are essential in phase difference-based auto-focusing, contrast auto-focusing has a relatively low cost. However, contrast auto-focusing is slower and less accurate than phase difference-based auto-focusing.

SUMMARY

An embodiment is directed to an image sensor capable of performing auto-focusing without a phase difference detecting sensor and an optical system.

In accordance with an embodiment, an image sensor includes pixels arranged in two dimensions, wherein at least one pixel includes: a photoelectric conversion layer formed in a substrate; a first color filter layer formed over the photoelectric conversion layer; and a second color filter layer formed over the first color filter layer and that defines an opening that is eccentrically formed with respect to an optical axis of the photoelectric conversion layer.

All the pixels may include the first color filter layer, and all or some of the pixels may include the second color filter layer. Each of the first color filter layer and the second color filter layer may include one selected from the group consisting of a red filter, a green filter, and a blue filter, and the first color filter layer and the second color filter layer have different color filters from each other. Each of the first color filter layer and the second color filter layer may include one selected from the group consisting of a cyan filter, a magenta filter, and a yellow filter, and the first color filter layer and the second color filter layer may have different color filters from each other. The second color filter layer of the at least one pixel may be extended into an upper portion of the first color filter layer of an adjacent pixel.

The image sensor may further include: an intermediate layer disposed between the photoelectric conversion layer and the first color filter layer; and a trench formed in the intermediate layer that corresponds to an area in which the first color filter layer and a second color filter layer overlap with each other. The intermediate layer may include an inter-layer dielectric layer or the substrate. The entire or part of the first color filter layer or the second color filter layer may fill the trench.

The image sensor may further include: a planarization layer disposed over the first color filter layer and the second color filter layer; and a micro lens disposed over the planarization layer. An optical axis of the micro lens and an optical axis of the photoelectric conversion layer may be aligned in a pixel positioned at a center of the pixels, and the optical axis of the micro lens and the optical axis of the photoelectric conversion layer may deviate from each other, going from the center of the pixels to an edge area of the pixels. The optical axis of the photoelectric conversion layer may be disposed more outward than the optical axis of the micro lens, going from the center of the pixels to the edge area of the pixels.

In accordance with another embodiment, an image sensor includes pixels arranged in two dimensions, wherein at least one pixel includes: a photoelectric conversion layer formed in a substrate; a color filter layer formed over the photoelectric conversion layer; and a shading filter layer formed in the same layer as the color filter layer and that defines an opening that is eccentrically formed with respect to an optical axis of the photoelectric conversion layer.

All the pixels may include the color filter layer, and each of the color filter layers of the pixels may overlap with the entire or a portion of the photoelectric conversion layer. A pixel whose color filter layer may overlap with a portion of the photoelectric conversion layer includes the shading filter layer that overlaps with a different portion of the photoelectric conversion layer. The color filter layer may include one selected from the group consisting of a red filter, a green falter, a blue filter, a cyan filter, a magenta filter, and a yellow filter. The shading filter layer may include a black filter or an infrared ray cutoff filter. The shading filter layer may include a stacked structure where two or more filters selected from the group consisting of a red filter, a green filter, a blue filter, a cyan filter, a magenta filter, and a yellow filter are stacked.

The image sensor may further include: an intermediate layer disposed between the photoelectric conversion layer, and the color filter and the shading filter layers; and a trench formed in the intermediate layer corresponding to the color filter layer or the shading filter layer. The intermediate layer may include an inter-layer dielectric layer or the substrate. The entire or part of the color filter layer or the shading filter layer may fill the trench.

The image sensor may further include: a planarization layer disposed over the color filter layer and the shading filter layer; and a micro lens disposed over the planarization layer. An optical axis of the micro lens and an optical axis of the photoelectric conversion layer may be aligned in a pixel positioned at a center of the pixels, and the optical axis of the micro lens and the optical axis of the photoelectric conversion layer may deviate from each other, going from the center of the pixels to edge area of the pixels. The optical axis of the photoelectric conversion layer may be disposed more outward than the optical axis of the micro lens, going from the center of the pixels to the edge area of the pixels.

DETAILED DESCRIPTION

Figure 1:
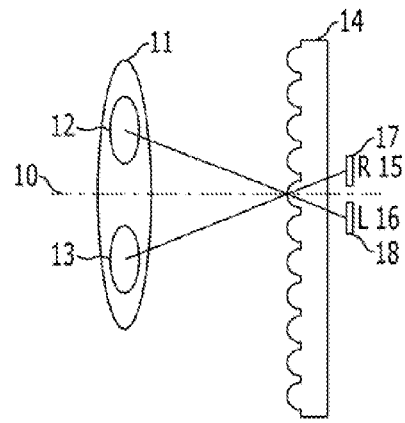
FIG. 1 illustrates detecting of phase differences using phase-difference detecting pixels.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete and will fully convey the scope of the present invention to those skilled in the art. Throughout the disclosure, like reference numerals refer to like parts in the various figures and embodiments of the inventive concept.

The drawings are not necessarily to scale and, in some instances, proportions may have been exaggerated to clearly illustrate features of the embodiments. When a first layer is referred to as being "on" a second layer or "on" a substrate, it not only refers to the first layer being formed directly on the second layer or the substrate but also a case in which a third layer exists between the first layer and the second layer or the substrate.

The following embodiments are directed to an image sensor mounted on an auto-focus system. More specifically, the following embodiments describe an image sensor mounted on an auto-focus system with a phase-difference detecting scheme. The embodiments provide an image sensor that may perform phase difference-based auto-focusing without a phase difference detecting sensor and an optical system. To accomplish this, the embodiments have multiple phase difference detecting pixels capable of detecting phase differences in addition to image pixels that acquire images. In the embodiments, pixels arranged in two dimensions may be divided into image pixels and phase difference detecting pixels, or there may be only phase difference detecting pixels which also function as image sensing pixels.

Before the image sensor in accordance with the embodiments is described, the principle of detecting phase differences in the phase difference detecting pixels is described with reference to FIGS. 1 to 4.

Figure 2A:
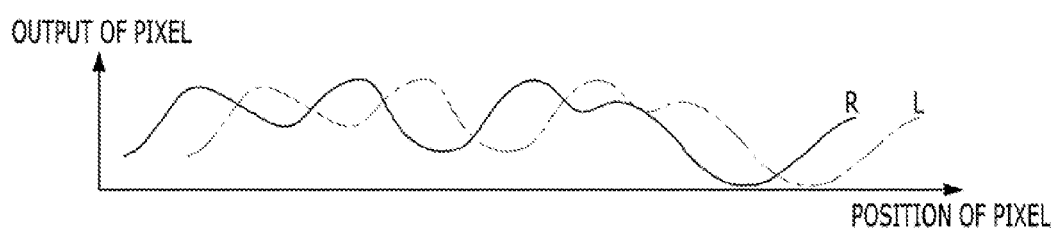
FIGS. 2A and 2B are graphs illustrating the phase difference of FIG. 1.
Figure 2B:
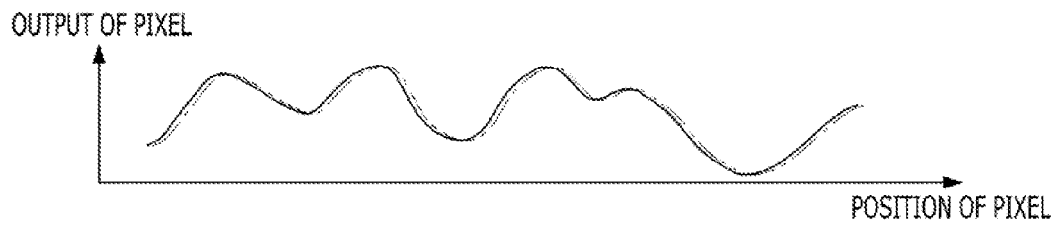

FIG. 1 illustrates detecting phase differences using a phase-difference detecting pixel. FIGS. 2A and 2B are graphs describing the phase difference of FIG. 1.

Referring to FIG. 1, a pixel R 15 and a pixel L 16 are required to detect a phase difference by using phase difference detecting pixels. Incident light entering through an imaging lens 11 passes through a micro lens array 14 and is guided into the pixel R 15 and the pixel L 16 that include a photoelectric conversion layer 22 (shown in FIG. 3). The pixel R 15 and the pixel L 16 include openings for restricting a pupil 12 and a pupil 13 from the imaging lens 11. The openings are defined by shading masks 17 and 18 that restrict the pupils 12 and 13 from the imaging lens 11. Among the pupils 12 and 13 of the imaging lens 11, the incident light from the pupil 12 that is disposed over an optical axis 10 of the imaging lens 11 is guided into the pixel L 16, whereas the incident light from the pupil 13 that is disposed under the optical axis 10 of the imaging lens 11 is guided into the pixel R 15. The pixel R 15 and the pixel L 16 receive incident light, through the openings which are defined by the shading masks 17 and 18, that is reversely projected by the micro lens array 14 from the pupils 12 and 13. This is called "pupil division".

Continuous outputs of the pixel R 15 and the pixel L 16, which incorporate pupil division, are shown in FIGS. 2A and 2B. In the graphs of FIGS. 2A and 2B, the horizontal axis denotes the positions of the pixel R 15 and the pixel L 16, while the vertical axis denotes output values of the pixel R 15 and the pixel L 16. Comparing the outputs of the pixel R 15 and the pixel L 16, it may be seen that the outputs are the same but shifted, which corresponds to the phase difference. This is due to the image formation positions of light from the eccentrically formed pupils 12 and 13 of the imaging lens 11 being different from each other. As illustrated in FIG. 2A, when focus points of light from the eccentrically formed pupils 12 and 13 are inconsistent with each other, the pixel R 15 and the pixel L 16 exhibit an output phase difference. As illustrated in FIG. 2B, when the focus points of light from the eccentrically formed pupils 12 and 13 are consistent with each other, mages are formed at the same position. Additionally, the direction of focus may be determined from the focus difference. A "front-focusing" indicates that an object is in a front focus state. In front-focusing, the phase of the output of the pixel R 15 is shifted further to the left than that in the focused phase, and the phase of the output of the pixel L 16 is shifted further to the right than that in the focused phase. In contrast, "back-focusing" indicates that an object is in a back focus state. When back-focusing, the phase of the output of the pixel R 15 is shifted further to the right than that in the focused phase, and the phase of the output of the pixel L 16 is shifted further to the left than in the focused phase. The shift amount between the phases of the pixel R 15 and the pixel L 16 may be converted to a deviation amount between the points of focus.

Figure 3:
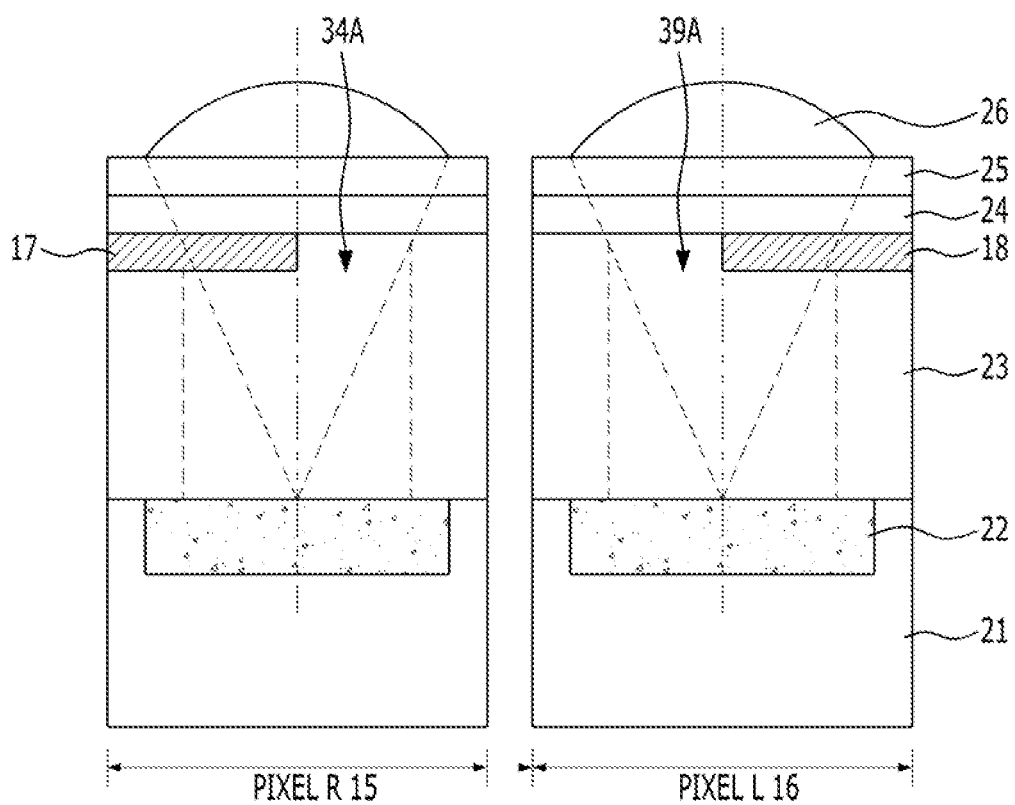
FIG. 3 illustrates the phase-difference detecting pixel of FIG. 1.

FIG. 3 illustrates the phase-difference detecting pixel of FIG. 1 including the pixel R 15 and the pixel L 16.

Referring to FIGS. 1 to 3, the phase difference detecting pixel includes the pixel R 15 and the pixel L 16. Each pixel R 15 and pixel L 16 includes a micro lens 26, a planarization layer 25, a color filter layer 24, shading masks 17 and 18, an intermediate layer 23, a photoelectric conversion layer 22, and a substrate 21. The intermediate layer 23 includes a line layer (not shown), and the photoelectric conversion layer 22 includes a photodiode. The shading masks 17 and 18 define the openings (refer to reference numerals '34A' and '39B' of FIGS. 4A and 4B) that restrict the pupils 12 and 13 from the imaging lens 11 (shown in FIG. 1). The shading masks 17 and 18 are line layers (not shown) or include a material for forming the line layers (not shown), for example, a metallic material. Therefore, the shading masks 17 and 18 restrict incident light entering the photoelectric conversion layer 22 by reflecting the incident light.

The incident light from an object is guided to the photoelectric conversion layer 22 of the pixel R 15 and the pixel L 16 through the micro lenses 26, and the charges generated in the photoelectric conversion layer 22, based on the incident light, become pixel information. The incident light from the object enters through the pupils 12 and 13 of the imaging lens 11, and the luminance information corresponding to the object may be obtained based on the positions of the pixel R 15 and the pixel L 16. The pixel R 15 and the pixel L 16 may obtain a pixel R 15 signal and a pixel L 16 signal through the shading masks 17 and 18, which have the phase difference illustrated in FIG. 2A. Specifically, the shading mask 17 and the shading mask 18 are disposed between the micro lenses 26 and the photoelectric conversion layers 22. The optical axis of the micro lenses 26, which in this example is the same as the optical axis of the photoelectric conversion layers 22, are represented by broken lines ( — -- ——-- ). The optical paths from the micro lenses 26 to the photoelectric conversion layers 22, which define the entire light receiving area in pixels R 15 and L 16, are represented by dashed lines ( ~  ~  ~  ~ ).

Figure 4A:
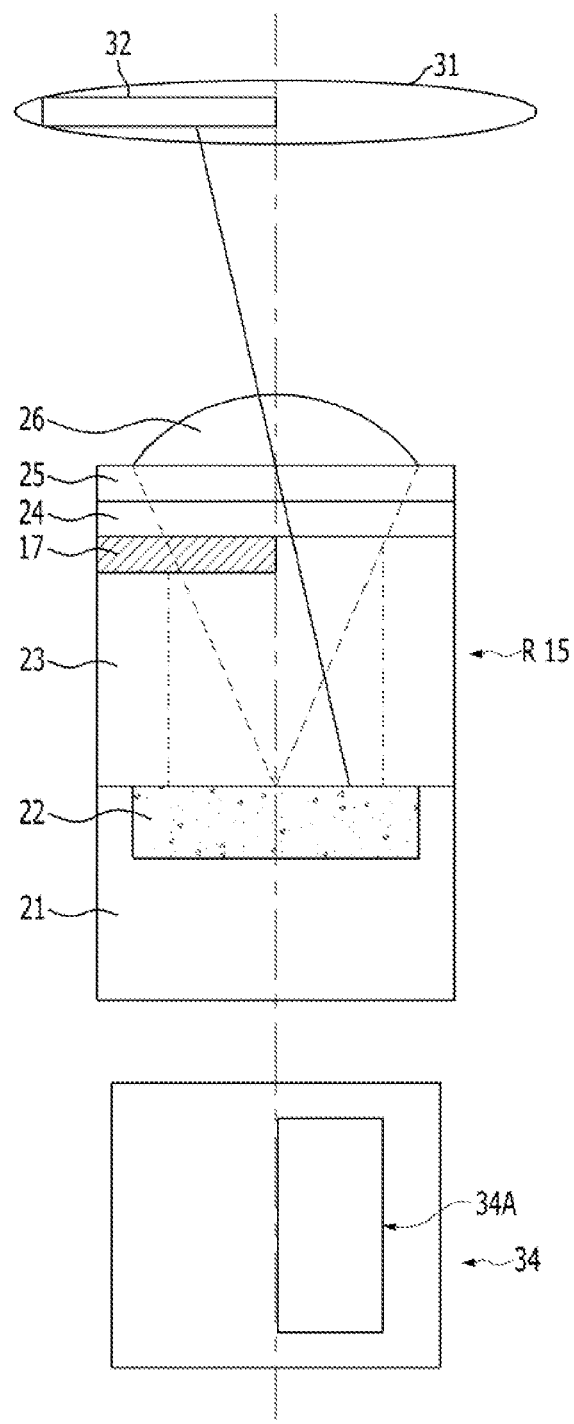
FIGS. 4A and 4B illustrate the relationship between an imaging lens and the position of the shading masks of the phase-difference detecting pixels shown in FIG. 3.
Figure 4B:
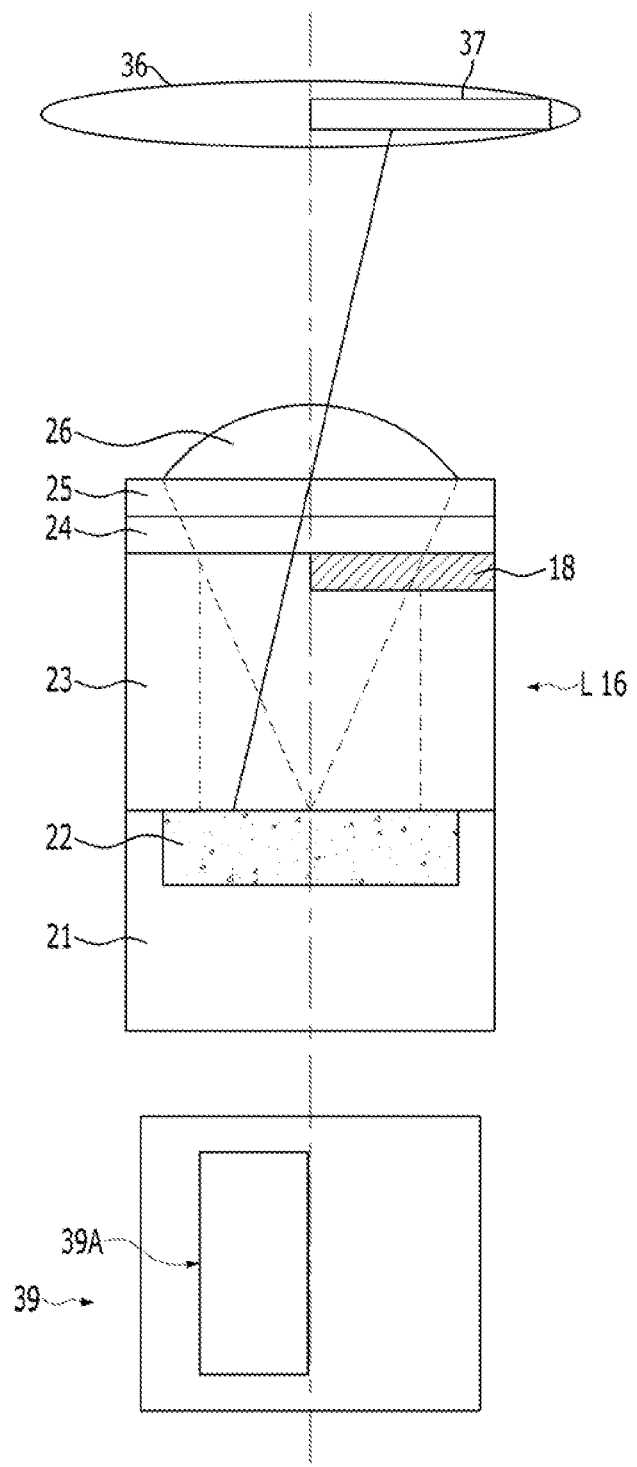

FIGS. 4A and 4B illustrate the relationship between imaging lenses and shading mask positions of the phase-difference detecting pixels shown in FIG. 3. FIG. 4A shows the pixel R 15, and FIG. 4B shows the pixel L 16.

FIG. 4A shows an imaging lens 31, a pixel R 15 of FIG. 3, a top view of a shading mask 34, an opening 34A of the shading mask 34, and a pupil 32 that is on the imaging lens 31 and incident on the shading mask 34. FIG. 4B shows an imaging lens 36, a pixel L 16 of FIG. 3, a top view of a shading mask 39, an opening 39A of the shading mask 39, and a pupil 37 that is on the imaging lens 36 and incident on the shading mask 39.

Incident light transmitted through the left pupil 32 or the right pupil 37 enters the pixel R 15 and the pixel L 16, respectively. The shading mask 34 and the shading mask 39 are set to have an aperture ratio of more or less 50% based on the optical axes. That is, the pixel R 15 and the pixel L 16 have an aperture ratio of about 50% including the boundary line of the optical axes or not including the optical axes with the optical axes of the imaging lenses 31 and 36. In FIGS. 4A and 4B, the optical axes of the imaging lenses 31 and 36 are illustrated by a broken line " —— - —— ". In the following embodiments, the aperture ratio may be approximately 50%. However, the aperture ratio is not restricted to a specific number and may be adjusted to suite the desired characteristics of the imaging sensing device.

As described above, the phase difference detecting pixels have shadings masks that restrict the pupils of the imaging lenses. The shadings masks are located between a color filter layer and a photoelectric conversion layer and under the micro lenses. As a result, an image sensor with phase difference detecting pixels requires an additional process for forming the shading masks, which leads to decreased productivity. Also, phase difference-based auto-focusing characteristics generally improve when the imaging lenses and micro lenses are as close to the shading masks as possible. However, since the shading masks are formed using a lining structure during fabrication, the shading masks are inevitably disposed between the color filter layer and the photoelectric conversion layer.

Therefore, the following embodiments describe an image sensor including phase difference detecting pixels that may define openings eccentrically disposed from optical axes without shading masks and improve the auto-focusing characteristics by reducing the distance between the imaging lens or micro lenses and the shading masks.

Figure 5:
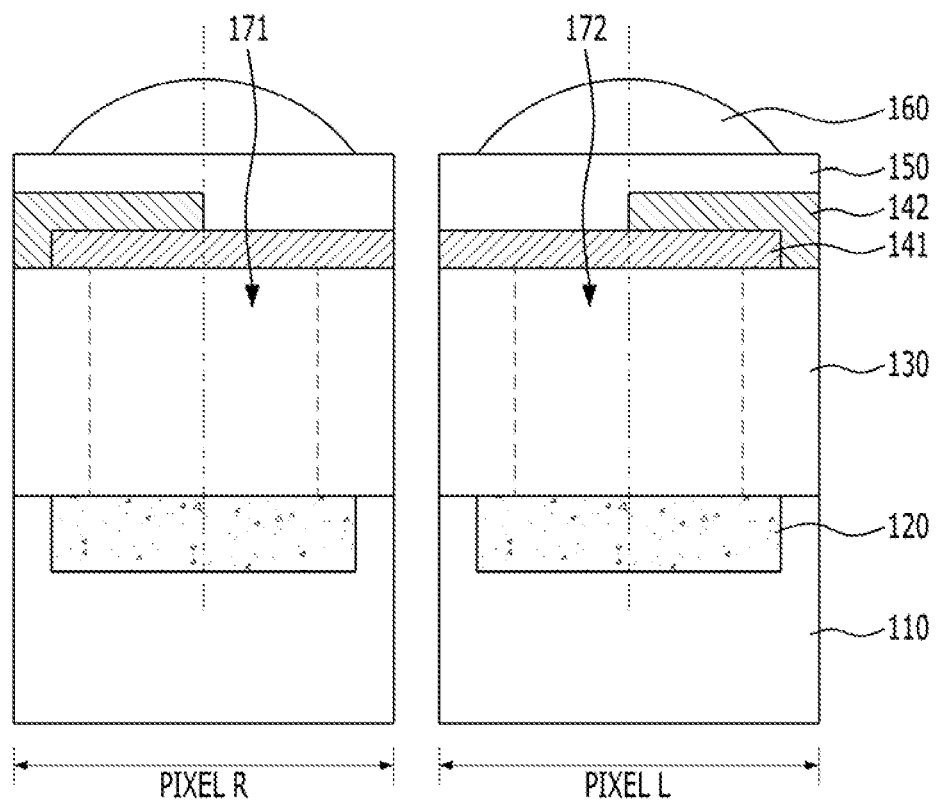
FIG. 5 illustrates a phase-difference detecting pixel in accordance with a first embodiment.

FIG. 5 illustrates a phase-difference detecting pixel in accordance with a first embodiment.

Figure 6A:
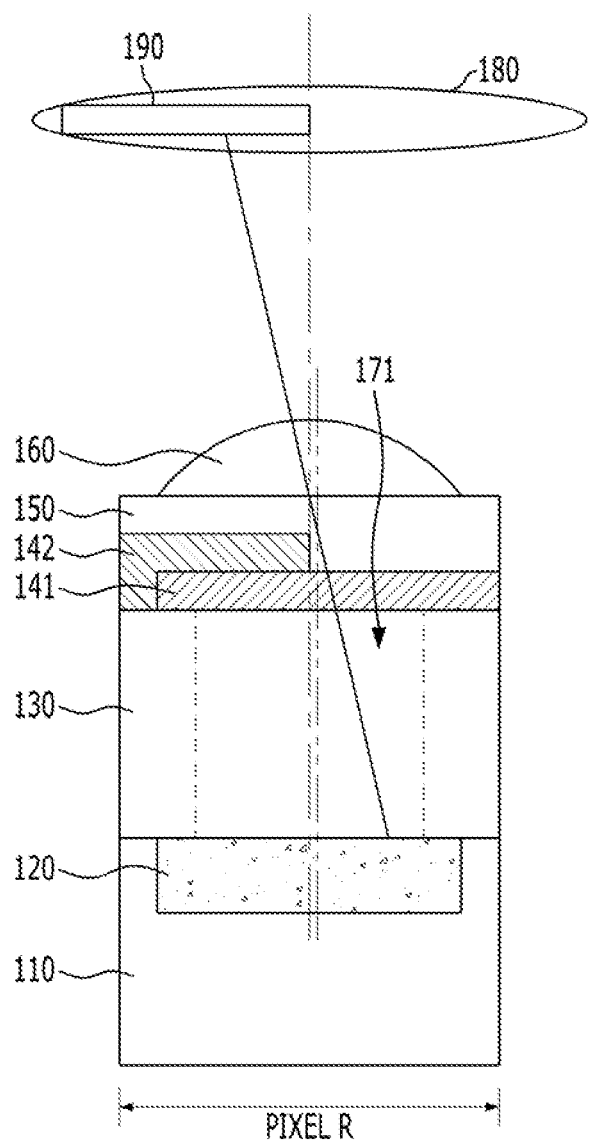
FIGS. 6A and 6B illustrate the relationship between an imaging lens and the position of an opening in the phase-difference detecting pixel shown in FIG. 5.
Figure 6B:
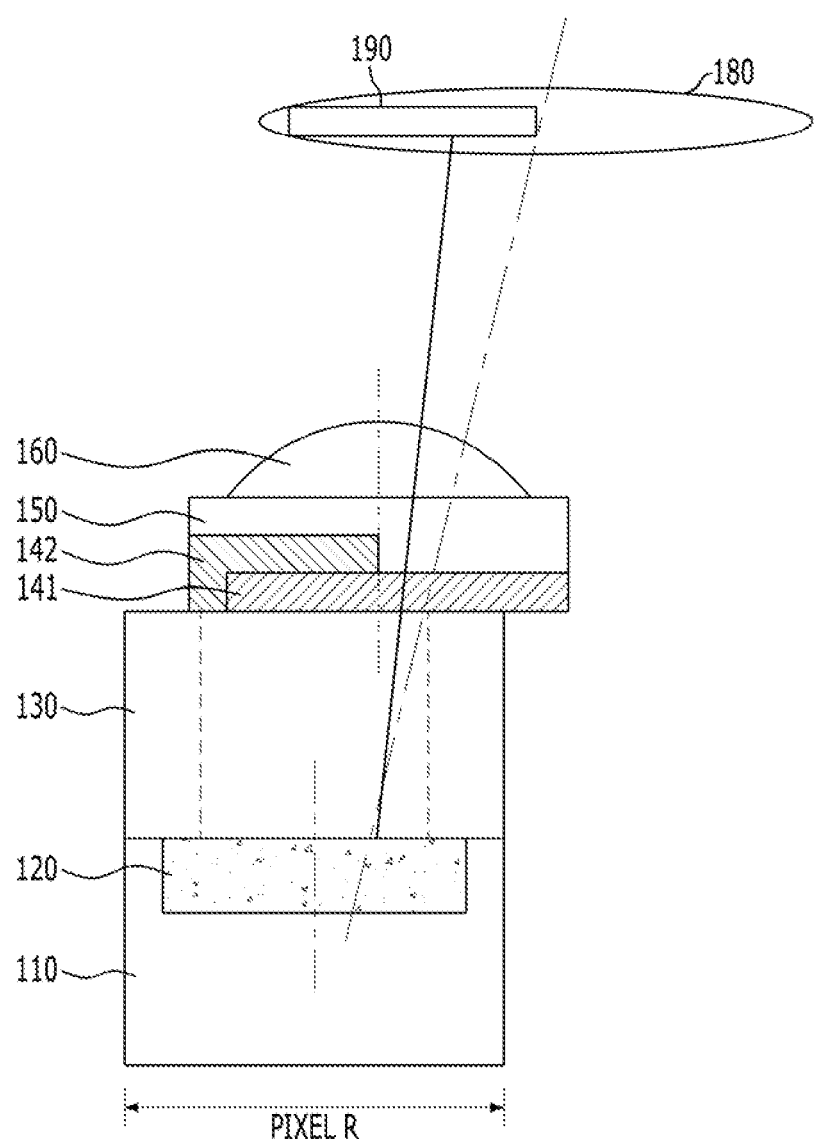

FIGS. 6A and 6B illustrate a relationship between an imaging lens and the position of an opening in the phase-difference detecting pixel shown in FIG. 5. For the sake of convenience in description, a pixel R is exemplarily described.

Referring to FIG. 5, the phase-difference detecting pixels in accordance with the first embodiment may include a pixel R and a pixel L. The pixel R and the pixel L may be disposed adjacent to each other, or may be disposed to be spaced apart from each other. The pixel R and the pixel L do not have to be disposed close to each other. Each pixel R and pixel L may include a photoelectric conversion layer 120, an intermediate layer 130, a first color filter layer 141, a second color filter layer 142, a planarization layer 150, and a micro lens 160 that are formed in a substrate 110.

Specifically, the image sensor in accordance with the first embodiment includes pixels that are arranged in two dimensions, and at least one pixel may include the photoelectric conversion layer 120 formed in the substrate 110, the first color filter layer 141 formed over the photoelectric conversion layer 120, and the second color filter layer 142 formed over the first color filter layer 141 and defines openings 171 and 172 which are eccentrically disposed with respect to the optical axis of the photoelectric conversion layer 120 or the optical axis of the micro lens 160. In FIG. 5, the optical axes of the photoelectric conversion layer 120 and the micro lens 160 are aligned and represented by a broken line " -- ———— ". The optical path of incident light entering from the micro lens 160 and continuing to the photoelectric conversion layer 120, which is also the entire light receiving area in the pixels R and L, is represented by dashed lines " ~ ~ ~ ~ ".

The substrate 110 may be a semiconductor substrate. The semiconductor substrate may be in a single crystal state, and it may include silicon-containing material. The substrate 110 may include a single crystal silicon-containing material.

The photoelectric conversion layer 120 may include a plurality of photoelectric converters that vertically overlap with each other. Each of the photoelectric converters may be a photodiode including an N-type impurity region and a P-type impurity region.

The first color filter layer 141 is intended for color separation, and all pixels may include the first color filter layer 141. The second color filter layer 142 may function as a shading mask that defines the openings 171 and 172, which are eccentrically disposed from the optical axis. Specifically, the structure in which the first color filter layer 141 and the second color filter layer 142 are sequentially stacked may function as a shading mask. Some or all of the pixels may include the second color filter layer 142. In an embodiment in which only some of the pixels include the second color filter layer 142, the pixels having the second color filter layer 142 may function as phase-difference detecting pixels, and the pixels that do not have the second color filter layer 142 may function as image pixels. However, if all the pixels include the second color filter layer 142, then they all may function as both phase-difference detecting pixels and image pixels.

T The first color filter layer 141 and the second color filter layer 142 may each include either a red filter, a green filter, or a blue filter. The first color filter layer 141 and the second color filter layer 142 may filter different colors. For example, when the first color filter layer 141 includes a red filter, the second color filter layer 142 may include a green filter or a blue filter. Both the first color filter layer 141 and the second color filter layer 142 may include one selected from a cyan filter, a magenta filter, and a yellow filter, and the first color filter layer 141 and the second color filter layer 142 may have different color filters. For example, when the first color filter layer 141 includes a cyan filter, the second color filter layer 142 may include a magenta filter or a yellow filter.

In one of the pixels, which is referred to as a "first pixel", hereafter, the second color filter layer 142 may be the first color filter layer 141 of an adjacent pixel (which is referred to as a "second pixel", hereafter. The second color filter layer 142 of a first pixel may the same layer as the first color filter layer 141 of the second pixel. That is, the second color filter layer 142 of a first pixel may extend into the second pixel to form the first color filter layer 141 of the second pixel. For example, when the first color filter layer 141 of the first pixel is a red filter and the first color filter layer 141 of the second pixel is a green filter (on a line where the red filter and the green filter are alternately disposed in a color filter array), the second color filter layer 142 of the first pixel may be the green filter of the second pixel extended over the red filter of the first pixel. As described above, the shading mask formed by the stacked structure having the first color filter layer 141 and the second color filter layer 142 may be realized by overlapping color filters of neighboring pixels.

The image sensor in accordance with the first embodiment may include an intermediate layer 130 disposed between the substrate 110 and the first color filter layer 141. The intermediate layer 130 may be formed of substrate 110 material or be an inter-layer dielectric layer having line structures. For example, when the intermediate layer 130 is comprised of substrate 110 material, the image sensor may be a back-side illumination (BSI) image sensor. When the intermediate layer 130 is an inter-layer dielectric layer having line structures the image sensor may be a front-side illumination (FSI) image sensor.

As illustrated in FIG. 6A, in the first embodiment, the optical axis of the micro lens 160 and the optical axis of the photoelectric conversion layer 120 may be aligned at the center of the pixel. In contrast, as illustrated in FIG. 6B, the optical axis of the micro lens 160 and the optical axis of the photoelectric conversion layer 120 may separate from each other as the optical axis moves away from the pixels located directly under the imaging lens 180 central axis. This corrects the direction of incident light that obliquely enters pixels disposed away from the optical axis of the imaging lens. Going from centrally located pixels to outer edge pixels, the optical axis of the photoelectric conversion layer 120 may be disposed more outwardly than the optical axis of the micro lens 160.

FIGS. 6A and 6B illustrate an imaging lens 180, the pixel R shown in FIG. 5, a shading mask formed by the structure having a stacked first color filter layer 141 and second color filter layer 142, and a pupil 190 over the imaging lens 180. In FIGS. 6A and 6B, the optical axis of the imaging lens 180 is represented by a one-dash broken line " - ———— - ", whereas the optical axis of the micro lens 160 is represented by a two-dash broken line "-- ———— --".

By stacking the first color filter layer 141 and the second color filter layer 142, the image sensor in accordance with the first embodiment may provide openings 17 and 172 that are eccentrically disposed from the optical axis of the photoelectric conversion layer without requiring an additional shading mask or a process for forming a shading mask. Therefore, the image sensor in accordance with the first embodiment may provide a phase-difference detecting pixel without extra fabrication steps, thereby improving the productivity of an image sensor fabrication process.

Additionally, by forming the shading mask of the first color filter layer 141 and the second color filter layer 142, the distance between the imaging lens 180 or the micro lens 160 and the shading mask may be decreased, resulting in improved phase difference-based auto-focusing characteristics.

Figure 7:
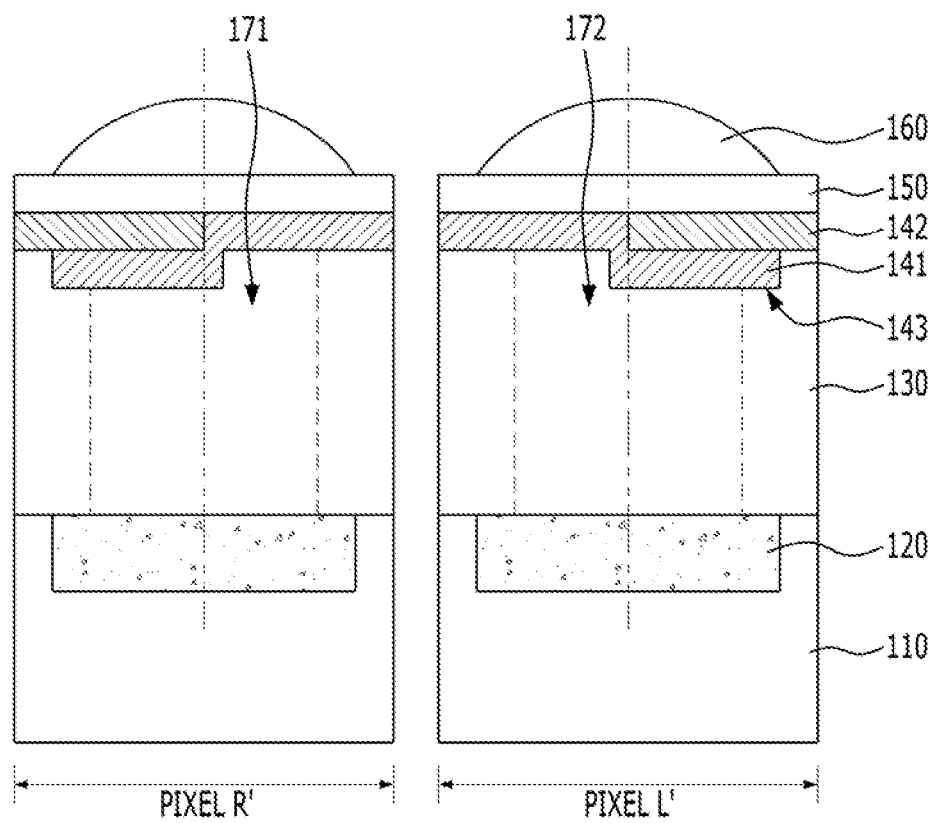
FIG. 7 illustrates a phase-difference detecting pixel in accordance with a modified example of the first embodiment.

FIG. 7 illustrates a phase-difference detecting pixel in accordance with a modified example of the first embodiment. FIG. 7 shows two pixels, Pixel R' and Pixel L'. For the sake of convenience, descriptions for structures that are substantially the same as those of the first embodiment have been omitted.

Referring to FIG. 7, the modified example of the first embodiment includes pixels arranged in two dimensions, and at least one pixel may include a photoelectric conversion layer 120, a first color filter layer 141, a second color filter layer 142, an intermediate layer 130 and a trench 143. The photoelectric conversion layer 120 is formed in the substrate 110. The first color filter layer 141 is formed over the photoelectric conversion layer 120. The second color filter layer 142 is formed over the first color filter layer 141 and defines openings 171 and 172 that are eccentrically formed with respect to the optical axis of the photoelectric conversion layer 120 and the optical axis of the micro lens 160. The intermediate layer 130 is disposed between the substrate 110 and the first color filter layer 141. The trench 143 is formed in the intermediate layer 130 in an area in which the first color filter layer 141 and the second color filter layer 142 overlap. The pixel may include a planarization layer 150 over the first color filter layer 141 and the second color filter layer 142, and a micro lens 160 over the planarization layer 150.

The trench 143 formed in the intermediate layer 130 provides sufficient space to form the stacked structure, consisting of the first color filter layer 141 and the second color filter layer 142, which functions as a shading mask. Therefore, all or a portion of the first color filter layer 141 or the second color filter layer 142 may fill the trench 143. For example, as illustrated in the FIG. 7, a portion of the first color filter layer 141 may fill the trench 143. Otherwise, the first color filter layer 141 may fill a portion of the trench 143 and all or a portion of the second color filter layer 142 may fill the other portion of the trench 143.

In the modified example of the first embodiment, the stacked structure of the first color filter layer 141 and the second color filter layer 142 may have sufficient thickness due to the trench 143. Having a stacked structure may allow for incident light to be blocked more effectively, which is especially advantageous in a high-illumination environment. Moreover, the trench allowing the stacked structure to be formed with sufficient thickness may prevent deterioration in image sensor characteristics due to variations in the fabrication process.

With the trench 143, the step height difference originating from the formation of the second color filter layer 142 over the first color filter layer 141 may also be alleviated, which leads to a thinner planarization layer 150 and reduced loss of incident light.

Figure 8:
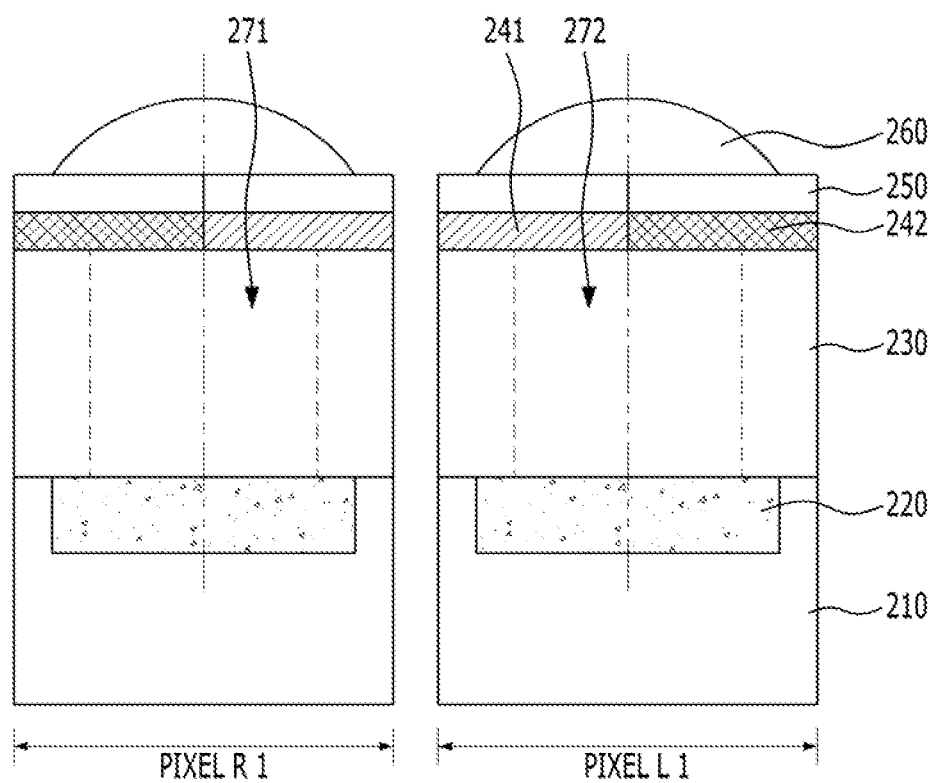
FIG. 8 illustrates a phase-difference detecting pixel in accordance with a second embodiment.

FIG. 8 illustrates a phase-difference detecting pixel in accordance with a second embodiment.

Referring to FIG. 8, the phase-difference detecting pixel in accordance with the second embodiment may include a pixel R1 and a pixel L1. The pixel R1 and the pixel L1 may be adjacent or spaced apart from each other. The pixel R1 and the pixel L1 may each include a photoelectric conversion layer 220, an intermediate layer 230, a color filter layer 241, a shading filter layer 242, a planarization layer 250, and a micro lens 260 that are formed over a substrate 210. In FIG. 8, the optical axis of the micro lens 260 and the optical axis of the photoelectric conversion layer 220 are represented by a two-dash broken line "-- ———————— --". The optical path of incident light entering from the micro lens 260 and going toward the photoelectric conversion layer 220, that is, the entire light receiving area of the pixel R1 and the pixel L1) is represented by dashed lines "- - - - -".

In an image sensor in accordance with the second embodiment including pixels arranged in two dimensions, at least one pixel may include the photoelectric conversion layer 220 formed in the substrate 210, the color filter layer 241 formed over the photoelectric conversion layer 220, and the shading filter layer 242 formed on the same plane as the color filter layer 241 and defining openings 271 and 272 that are eccentrically located with respect to the optical axis of the photoelectric conversion layer 220.

The substrate 210 may include a semiconductor substrate. The semiconductor substrate may be in a single crystal state and may include a silicon-containing material. The substrate 210 may include a single crystal silicon-containing material.

The photoelectric conversion layer 220 may include a plurality of photoelectric converters that vertically overlap with each other. Each of the photoelectric converters may be a photodiode including an N-type impurity region and a P-type impurity region.

All of the pixels may each have a color filter layer 241 for color separation. The color filter layer 241 may overlap with part or the entire photoelectric conversion layer 220.

The color filter layer 241 may be selected from a red filter, a green filter, a blue filter a cyan filter, a magenta filter, and a yellow filter.

The shading filter layer 242 may perform the same function as the shading mask in the comparative example. The pixels in which the color filter layer 241 overlaps with a portion of the photoelectric conversion layer 220 may include a shading filter layer 242 that overlaps with the remaining portion of the photoelectric conversion layer 220. That is, the pixels in which the color filter layer 241 covers the entire photoelectric conversion layer 220 may serve as image pixels. The pixels in which the color filter layer 241 and the shading filter layer 242 overlap with a portion of the photoelectric conversion layer 220 may function as both phase-difference detecting pixels and image pixels.

Since the shading filter layer 242 is positioned on the same plane as the color filter layer 241, the shading filter layer 242 may include a color filter material. The shading filter layer 242 and the color filter layer 241 may be formed at the same time. The shading filter layer 242 may include a black filter or an infrared ray cutoff filter. Additionally, the shading filter layer 242 ray include a stacked structure of two or more filters selected from red, green, blue, cyan, magenta, and, yellow filters.

The image sensor in accordance with the second embodiment may include an intermediate layer 230 disposed between the substrate 210 and the color filter layer 241 and the shading filter layer 242, a planarization layer 250 over the color filter layer 241 and the shading filter layer 242, and a micro lens 260 over the planarization layer 250.

The intermediate layer 230 may be included in the substrate 210 or it may be an inter-layer dielectric layer including line structures. For example, when the intermediate layer 230 is the substrate 210, the image sensor in accordance with the second embodiment may be a back-side illumination (BSI) image sensor. When the intermediate layer 230 is an inter-layer dielectric layer including line structures, the image sensor in accordance with the second embodiment may be a front-side illumination (FSI) image sensor.

Also, although not illustrated in the drawings, the image sensor in accordance with the second embodiment may further include a trench (not shown) that is formed in the intermediate layer 230 to provide space for the color filter layer 241 or the shading filter layer 242 to be sufficiently thick. The trench may be partially or completely filled by the color filter layer 241 or the shading filter layer 242.

In the second embodiment, as in the first embodiment, the optical axis of the micro lens 260 and the optical axis of the photoelectric conversion layer 220 may be aligned over a centrally located pixel (refer to FIG. 6A). Furthermore, as illustrated in the corresponding reference numbers of FIG. 6B, moving from the center to the edges of the pixels, the optical axis of the micro lens 260 and the optical axis of the photoelectric conversion layer 220 may deviate from each other. This is to correct the incident light when the incident light obliquely enters pixels that are disposed away from the optical axis of the imaging lens. Moving from the center to the edges of the pixels, the optical axis of the photoelectric conversion layer 220 may be disposed more outward than the optical axis of the micro lens 260.

With the shading filter layer 242 including a color filter material, the image sensor in accordance with the second embodiment may provide openings 271 and 272 that are eccentrically disposed from the optical axis without additionally requiring a shading mask or a process for forming a shading mask. Therefore, the image sensor in accordance with the second embodiment may make it easier to provide a phase-difference detecting pixel and, in turn, improving productivity of the image sensor fabrication process.

Additionally, since the shading filter layer 242 is disposed in the same layer as the color filter layer 241, the distance from the imaging lens and the micro lens 260 to the shading filter layer 242 may be decreased, which leads to improved phase difference-based auto-focusing characteristics.

According to an embodiment, an opening eccentrically formed from an optical axis may be defined by using a color filter without requiring a shading mask. Since the process for forming the shading mask is omitted, the fabrication process may be simplified and productivity may be improved. Also, the distance from the imaging lens and micro lens to the shading mask may be reduced, resulting in improved auto-focusing characteristics.

While the present invention has been described with respect to specific embodiments, it will be apparent to those skilled in the art that various changes and modifications may be made without departing from the spirit and scope of the invention as defined in the following claims.

What is claimed is:

1. An image sensor, comprising:
 a plurality of pixels arranged in two dimensions,
 wherein at least one pixel includes:
   a photoelectric conversion layer formed in a substrate;
   a first color filter layer formed over the photoelectric conversion layer; and
   a second color filter layer formed over the first color filter layer, and that defines an opening that is eccentrically formed with respect to an optical axis of the photoelectric conversion layer, wherein an area where the first color filter layer and the second color filter layer overlap with each other is located directly over the photoelectric conversion layer.

2. The image sensor of claim 1, wherein all the pixels include the first color filter layer, and
all or some of the pixels include the second color filter layer.

3. The image sensor of claim 1, wherein each of the first color filter layer and the second color filter layer includes one selected from the group consisting of a red filter, a green filter, and a blue filter, and the first color filter layer and the second color filter layer have different color filters from each other.

4. The image sensor of claim 1, wherein each of the first color filter layer and the second color filter layer includes one selected from the group consisting of a cyan filter, a magenta filter, and a yellow filter, and the first color filter layer and the second color filter layer have different color filters from each other.

5. The image sensor of claim 1, wherein the second color filter layer of the at least one pixel is extended into an upper portion of the first color filter layer of an adjacent pixel.

6. The image sensor of claim 1, further comprising:
an intermediate layer disposed between the photoelectric conversion layer and the first color filter layer; and
a trench formed in the intermediate layer that corresponds to the area in which the first color filter layer and the second color filter layer overlap with each other.

7. The image sensor of claim 6, wherein the intermediate layer includes an inter-layer dielectric layer or the substrate.

8. The image sensor of claim 6, wherein the entire or part of the first color filter layer or the second color filter layer fills the trench.

9. The image sensor of claim 1, further comprising:
a planarization layer disposed over the first color filter layer and the second color filter layer; and
a micro lens disposed over the planarization layer.

10. The image sensor of claim 9, wherein an optical axis of the micro lens and an optical axis of the photoelectric conversion layer are aligned in a pixel positioned at a center of the pixels, and
the optical axis of the micro lens and the optical axis of the photoelectric conversion layer deviate from each other, going from a center of the pixels to an edge area of the pixels.

11. The image sensor of claim 10, wherein the optical axis of the photoelectric conversion layer is disposed more outward than the optical axis of the micro lens, going from the center of the pixels to the edge area of the pixels.

12. An image sensor, comprising:
a plurality of pixels arranged in two dimensions,
wherein at least one pixel includes:
a photoelectric conversion layer formed in a substrate;
a color filter layer formed over the photoelectric conversion layer; and
a shading filter layer formed in the same layer as the color filter layer and that defines an opening that is eccentrically formed with respect to an optical axis of the photoelectric conversion layer.

13. The image sensor of claim 12, wherein all the pixels include the color filter layer, and
each of the color filter layers of the pixels overlaps with the entire or a portion of the photoelectric conversion layer.

14. The image sensor of claim 13, wherein a pixel whose color filter layer overlaps with a portion of the photoelectric conversion layer includes the shading filter layer that overlaps with a different portion of the photoelectric conversion layer.

15. The image sensor of claim 12, wherein the color filter layer includes one selected from the group consisting of a red filter, a green filter, a blue filter, a cyan filter, a magenta filter, and a yellow filter.

16. The image sensor of claim 12, wherein the shading filter layer includes a black filter or an infrared ray cutoff filter.

17. The image sensor of claim 12, wherein the shading filter layer includes a stacked structure in which two or more filters selected from the group consisting of a red filter, a green filter, a blue filter, a cyan filter, a magenta filter, and a yellow filter are stacked.

18. The image sensor of claim 12, further comprising:
an intermediate layer disposed between the photoelectric conversion layer, and the color filter and shading filter layers; and
a trench formed in the intermediate layer corresponding to the color filter layer or the shading filter layer.

19. The image sensor of claim 18, wherein the intermediate layer includes an inter-layer dielectric layer or the substrate.

20. The image sensor of claim 18, wherein the entire or part of the color filter layer or the shading filter layer fills the trench.

21. The image sensor of claim 12, further comprising:
a planarization layer disposed over the color filter layer and the shading filter layer; and
a micro lens disposed over the planarization layer.

22. The image sensor of claim 21, wherein an optical axis of the micro lens and an optical axis of the photoelectric conversion layer are aligned in a pixel positioned at a center of the pixels, and
the optical axis of the micro lens and the optical axis of the photoelectric conversion layer deviate from each other, going from the center of the pixels to an edge area of the pixels.

23. The image sensor of claim 22, wherein the optical axis of the photoelectric conversion layer is disposed more outward than the optical axis of the micro lens, going from the center of the pixels to the edge area of the pixels.

* * * * *